(12) United States Patent
Lee

(10) Patent No.: US 8,368,111 B2
(45) Date of Patent: Feb. 5, 2013

(54) SEMICONDUCTOR LIGHT EMITTING DEVICE AND METHOD FOR MANUFACTURING THEREOF

(75) Inventor: Sang Youl Lee, Gwangsan-gu (KR)

(73) Assignee: LG Innotek Co., Ltd., Seoul (KR)

( * ) Notice: Subject to any disclaimer, the term of this patent is extended or adjusted under 35 U.S.C. 154(b) by 375 days.

(21) Appl. No.: 11/913,302

(22) PCT Filed: Feb. 14, 2007

(86) PCT No.: PCT/KR2007/000791
§ 371 (c)(1),
(2), (4) Date: Oct. 31, 2007

(87) PCT Pub. No.: WO2007/094613
PCT Pub. Date: Aug. 23, 2007

(65) Prior Publication Data
US 2010/0219442 A1    Sep. 2, 2010

(30) Foreign Application Priority Data
Feb. 14, 2006  (KR) .................. 10-2006-0014091

(51) Int. Cl.
*H01L 33/38* (2010.01)
(52) U.S. Cl. .............. 257/99; 257/621; 257/E33.065
(58) Field of Classification Search ............ 257/79–103, 257/621, 622, E33.062, E33.063, E33.064, 257/E33.065, E33.066; 438/42–44, 106–127
See application file for complete search history.

(56) References Cited

U.S. PATENT DOCUMENTS

| 2002/0017653 | A1* | 2/2002 | Chuang | 257/103 |
|---|---|---|---|---|
| 2004/0217361 | A1* | 11/2004 | Negley | 257/79 |
| 2004/0245543 | A1* | 12/2004 | Yoo | 257/103 |
| 2005/0012109 | A1* | 1/2005 | Kohno et al. | 257/103 |
| 2005/0098792 | A1* | 5/2005 | Lee et al. | 257/103 |
| 2005/0104081 | A1* | 5/2005 | Kim et al. | 257/99 |
| 2005/0199891 | A1* | 9/2005 | Kunisato et al. | 257/85 |
| 2009/0325334 | A1 | 12/2009 | Kwak et al. | |

FOREIGN PATENT DOCUMENTS

| JP | 2003-197966 A | 7/2003 |
|---|---|---|
| JP | 2004-006919 A | 1/2004 |
| JP | 2005-123522 | 5/2005 |
| JP | 2005-191219 | 7/2005 |
| KR | 2002-0048546 A | 6/2002 |
| KR | 10-2004-0005612 | 1/2004 |
| KR | 10-2005-0093876 | 9/2005 |
| KR | 10-0638823 B1 | 10/2006 |

OTHER PUBLICATIONS

Notice of Allowance dated Feb. 6, 2012 in Korean Application No. 10-2006-0014091, filed Feb. 14, 2006.

* cited by examiner

*Primary Examiner* — Steven J Fulk
*Assistant Examiner* — Eric Ward
(74) *Attorney, Agent, or Firm* — Saliwanchik, Lloyd & Eisenschenk

(57) ABSTRACT

Provided is a semiconductor light emitting device and a method for manufacturing the same. The semiconductor light emitting device includes a light emitting structure, an insulating substrate, a first electrode, a second electrode, and a conductive supporting substrate. The light emitting structure includes a first conductive semiconductor layer, an active layer, and a second conductive semiconductor layer. The insulating substrate is formed on the light emitting structure to include a contact groove. The first electrode is formed on the insulating substrate. The second electrode is formed under the light emitting structure. The conductive supporting substrate is formed under the second electrode.

13 Claims, 3 Drawing Sheets

SEMICONDUCTOR LIGHT EMITTING DEVICE AND METHOD FOR MANUFACTURING THEREOF

Cross-Reference to Related Application

This application is the U.S. national stage application of International Patent Application No. PCT/KR2007/000791, filed Feb. 14, 2007, the disclosure of which is hereby incorporated by reference in its entirety.

TECHNICAL FIELD

The embodiment of the present invention relates to a semiconductor light emitting device and a method for manufacturing the same.

BACKGROUND ART

A light emitting diode (LED) is a semiconductor device that emits light using a re-combination of an electron and a hole. The LED is widely used in various types of light sources of optical communication systems and electronic apparatuses.

A semiconductor light emitting device that emits light of a blue or an ultraviolet wavelength is formed by growing a gallium nitride (GaN) crystal. Such a gallium nitride crystal can be grown on a gallium nitride substrate, however, which is very expensive due to the difficulty of the process.

Accordingly, most of the general gallium nitride based light emitting diode is formed by growing it on a heterogeneous substrate. The heterogeneous substrate may be a sapphire ($Al_2O_3$) substrate, a silicon carbide (SiC) substrate, a gallium arsenide (GaAs) substrate and the like. Among them, most commonly used is a sapphire substrate.

The semiconductor light emitting device can be divided into a horizontal-type light emitting device and a vertical-type light emitting device depending on an arrangement structure of an electrode.

In the horizontal-type light emitting device, both electrodes are formed parallel to the growth surface of an epilayer because a sapphire substrate is an insulator. Since both electrodes of the horizontal-type light emitting diode are formed in the same direction, an electrode area above a predetermined size is required for wire bonding. In other words, the size of the light emitting diode chip should be greater than a pre-determined size. This makes it difficult to improve a chip production per wafer. Such a light emitting device with a horizontal-type electrode structure has a limitation in enhancing an optical output and a light emitting efficiency.

In the vertical-type light emitting device, both electrodes are formed on and under the light emitting diode, respectively. Accordingly, the vertical-type light emitting diode is more effective to improve an optical output and a light emitting efficiency.

FIGS. 1 and 2 are schematic sectional views illustrating a related art method for manufacturing a vertical-type light emitting device.

Referring to FIGS. 1 and 2, an n-type nitride layer 20, an active layer 30, and a p-type nitride layer 40 is sequentially formed on a sapphire substrate.

A p-type electrode layer 45 is formed on the p-type nitride layer 40, and a submount substrate 60 is formed on the p-type electrode layer.

After the n-type nitride layer 20, the active layer 30, the p-type nitride layer 40, the p-type electrode layer 45, and the submount substrate 60 is stacked sequentially as described above, the sapphire substrate 10 is removed. Thereafter, an n-type electrode 70 is formed under the n-type semiconductor layer 20 as shown in FIG. 2. As a result, a vertical-type semiconductor light emitting diode 80 is manufactured.

Here, the sapphire substrate 10 is separated and removed from the light emitting structure by irradiating a laser beam on bottom of the sapphire substrate 10 using a laser lift off (LLO) method.

However, since a laser beam of a wavelength below 250 nm is irradiated on the sapphire substrate 10 in general, a portion of the irradiated laser beam may penetrate the light emitting structure and affect even the p-type electrode. Therefore, the re-liability of the semiconductor light emitting device may be deteriorated.

An etching and a mechanical polishing may also be used to remove the sapphire substrate 10. However, such methods also have the problem of causing damage to the nitride semiconductor layer.

DISCLOSURE OF INVENTION

Technical Problem

An embodiment provides a nitride semiconductor light emitting device and a method for manufacturing the same.

An embodiment provides a vertical-type nitride semiconductor light emitting device including a light emitting structure and a vertical-type electrode that can be inter-connected through a contact protrusion of an insulating substrate, and a method for manufacturing the same.

Technical Solution

An embodiment provides a semiconductor light emitting device comprising: a light emitting structure including a first conductive semiconductor layer, an active layer, and a second conductive semiconductor layer; an insulating substrate on the light emitting structure to include a contact groove; a first electrode on the insulating substrate; a second electrode under the light emitting structure; and a conductive supporting substrate under the second electrode.

An embodiment provides a method for manufacturing a semiconductor light emitting device, the method comprising: forming a contact groove in one surface of an insulating substrate; forming a light emitting structure on the one surface of the insulating substrate; forming a second electrode on the light emitting structure; forming a conductive supporting substrate on the second electrode; exposing the contact groove to another surface of the insulating substrate; and forming a first electrode electrically connected to the light emitting structure through the contact groove.

Advantageous Effects

According to the present invention, a process for removing a sapphire substrate is not required, and therefore it is possible to prevent a damage to a semiconductor light emitting device, which has been caused while the sapphire substrate is removed.

BEST MODE FOR CARRYING OUT THE INVENTION

It will be understood that when a layer, a region, a pattern or a structure is referred to as being "on" or "under" a substrate, a layer, a region, a pad or a pattern in the descriptions of the embodiments, the term "on" may denote "directly on", or "indirectly on", and the term "under" may denote "directly under" or "indirectly under". In addition, the terms "on" and "under" are relative terms depending on a viewing direction of the light emitting device.

Hereinafter, preferred embodiments of the present invention will be described in detail with reference to accompanying drawings.

Figure 1:
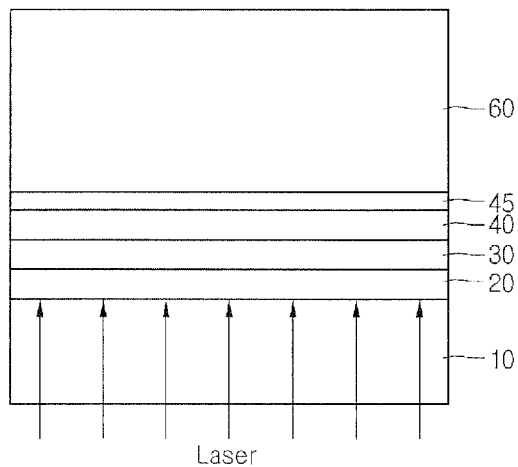
FIGS. 1 and 2 are schematic sectional views illustrating a related art method for manufacturing a vertical-type semiconductor light emitting device.
Figure 2:
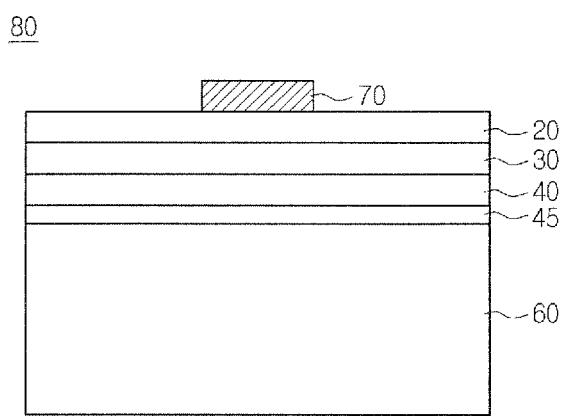
Figure 3:
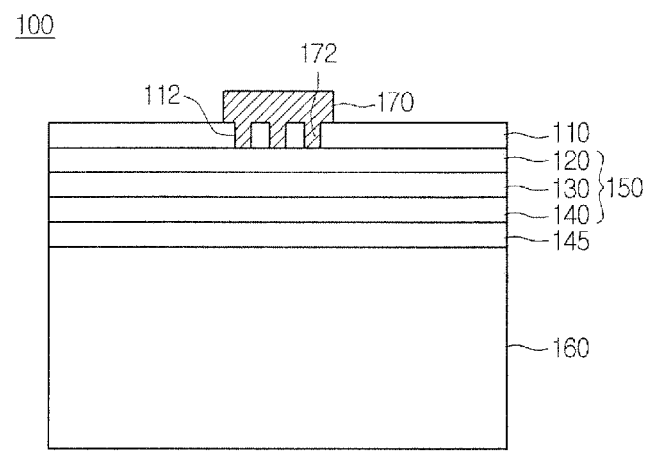
FIG. 3 is a sectional view illustrating a semiconductor light emitting device according to an embodiment of the present invention.

FIG. 3 is a sectional view illustrating a semiconductor light emitting device according to an embodiment of the present invention.

Referring to FIG. 3, the semiconductor light emitting device 100 includes an insulating substrate 110, a light emitting structure 150, a first electrode 170, a conductive supporting substrate 160, and a second electrode 145.

The insulating substrate 110 is a transparent substrate which transmits light emitted from the light emitting structure 150, and it may be a sapphire substrate.

At least one contact groove 112 is formed in the insulating substrate 110. A first electrode 170 is formed on the insulating substrate 110. A contact protrusion 172 is formed in the contact groove 112. The first electrode 170 and a first conductive semi-conductor layer 120 of the light emitting structure 150 can be interconnected through the contact protrusion 172. Here, the contact protrusion 172 may be filled with a material that can make an ohmic contact with a semiconductor layer of the light emitting structure 150, such as a material forming the first electrode and a conductive material.

Figure 10:
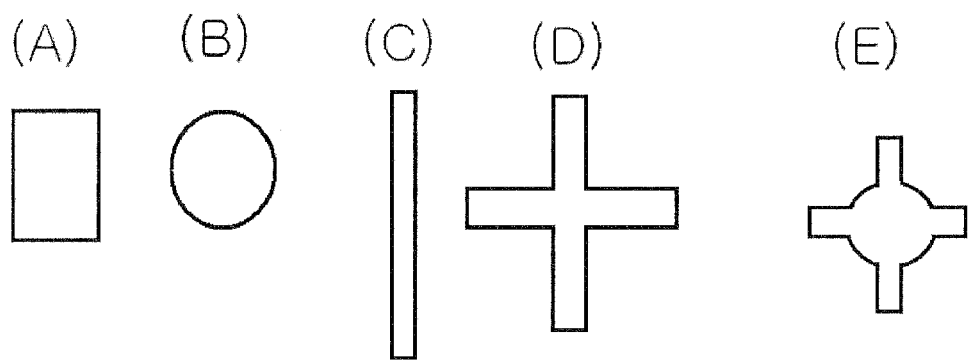
FIG. 10 (A)-(E) is a top view illustrating contact grooves according to embodiments of the present invention.

The insulating substrate 110 has a thickness of 5~100μm. The contact groove 112 has a depth equal to or larger than the thickness of the insulating substrate 110, and has a width of 5~100μm. The thickness or width of the contact groove 112 may vary with the size of the light emitting device. Referring to FIG. 10 (A)-(E), the contact groove 112 may be formed to have one of a circular (B) or polygonal shape (A), a shape of at least one line (C), a shape of a plurality of lines crossing each other (D), and a radial shape (E). Here, the contact groove 112 includes a hole having one open side and a general hole.

The light emitting structure 150 includes a first conductive semiconductor layer 120, an active layer 130, and a second conductive semiconductor layer 140. The first conductive semiconductor layer 120 is formed under the insulating substrate 110, and includes an n-type nitride layer doped with impurities such as Si. The active layer 130 is formed under the first conductive semiconductor layer 120 to have a single or multiple quantum well structure. The second conductive semiconductor layer 140 is formed under the active layer 130, and includes a p-type nitride layer doped with impurities such as Mg. Here, the n-type and p-type nitride layers are formed of $In_x(Al_yGa_{1-y})N$ ($0 \leq x$, $0 \leq y$).

The light emitting structure 150 includes a first conductive semiconductor layer 120 of a p-type nitride layer and a second conductive layer 140 of a n-type nitride layer. The light emitting structure 150 may have npn or pnp junction structure instead of pn or np junction structure. At least one buffer layer (not shown) formed of such as GaN, AN, AlGaN, InGaN and AlGaInN may be interposed between the insulating substrate 110 and the first conductive semiconductor layer 120, to act as a buffer against strain associated with the insulating substrate.

The second electrode 145 is an electrode layer formed under the second conductive semiconductor layer 140. A conductive supporting substrate 160 is formed under the second electrode. The conductive supporting substrate 160 is a layer for supporting the semiconductor layer, and may be realized as a submount substrate.

The second electrode 145 may be a p-type electrode. In this case, the first electrode 170 is an n-type electrode. Also, the second electrode 145 may be an n-type electrode whereas the first electrode 170 is a p-type electrode.

In addition, the first electrode 170 corresponds to the conductive semiconductor layer formed under the insulating substrate 110. In other words, the first electrode 170 may be an n-type electrode when an n-type nitride layer is disposed under the insulating substrate 110. Also, the first electrode 170 may be a p-type electrode when a p-type nitride layer is disposed under the insulating substrate 110.

Here, the second electrode 145 may be a p-type electrode formed of one of Ni, Cr, Rh, Pd, Ti, Pt, Au, Ta, Al and Ag, or an alloy of at least two metals thereof. The first electrode 170 may be an n-type electrode formed of one of Ti, Al, In, Pd, Co, Ni, Si, Ge, Cr, Ag, Au, Rh, Pt and Ta, or an alloy of at least two metals thereof.

Since the process of removing an insulating substrate 110 is not required for the se miconductor light emitting device 100, it is possible to protect the light emitting structure from damage which may be caused while the insulating substrate is removed.

In addition, since the first electrode 170 is electrically connected to the first conductive semiconductor layer 120 through the contact protrusion 172 formed in the contact groove 112 of the insulating substrate 110, it is also possible to apply current which is input through the first electrode 170 to the active layer 130 without leakage.

Furthermore, since a portion of the insulating substrate 110 where the first electrode 170 is to be formed is defined with the aid of the contact groove 112, it is possible to improve the process for manufacturing the semiconductor light emitting device.

FIGS. 4 to 9 are sectional views illustrating a method for manufacturing a semi-conductor light emitting device according to an embodiment of the present invention.

Figure 4:
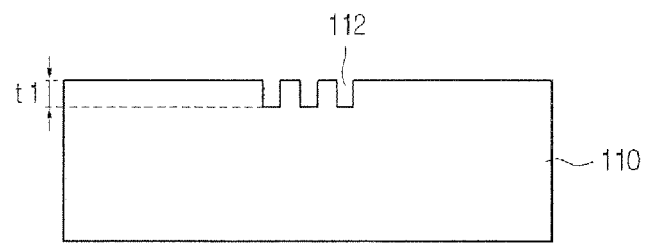
FIGS. 4 to 9 are sectional views illustrating a method for manufacturing a semi-conductor light emitting device according to an embodiment of the present invention.
Figure 5:
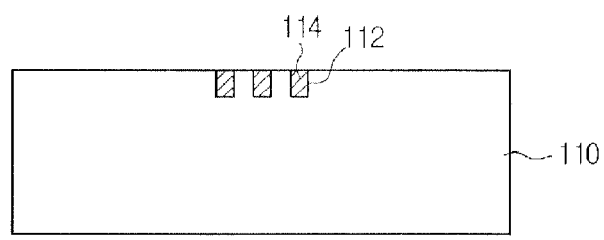

Referring to FIGS. 4 and 5, at least one contact groove 112 is formed in a pre-determined region of one surface of the insulating substrate 110. The contact groove 112 may be formed using a photolithography, a reactive ion etching (RIE), a micro-drill, and a wet etching. The region where the contact groove 112 is formed corresponds to the region where the first electrode 170 is to be formed.

The contact groove 112 may be formed to have at least one pattern of a circular or polygonal shape, a shape of at least one line, a shape of a plurality of lines crossing each other, and a radial shape.

Such contact grooves 112 may be formed to have the same or different depths (t1) or widths. For example, the contact grooves 112 may be formed to have depths (t1) or widths of 5~100μm.

The contact groove 112 is filled with a filler 114. The filler 114 may be a material that can maintain its shape during thin film growing of the nitride semiconductor under high temperature and high pressure. For example, the filler 114 may be formed of one of $SiO_2$, indium-tin-oxide (ITO), $ZnO_x$, $TiO_x$, W, Ti, Ta, Pt, Cr, Si, Mo, Ru and Re, or a mixture of at least two materials thereof.

Such a filler 114 fills the contact groove 112 when a thin film is formed on one surface of the insulation substrate 110. Then, a polishing process is performed on the surface of the insulating substrate, to expose the contact groove 112 filled with the filler 114.

In another embodiment of the present invention, when the depth and width of the contact groove 112 is small, a first conductive semiconductor 120 or a buffer layer may be formed without filling the contact groove 112 with a filler 114.

Figure 6:
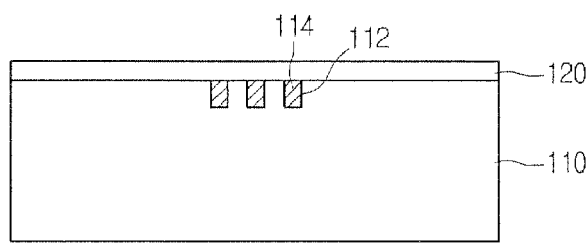
Figure 7:
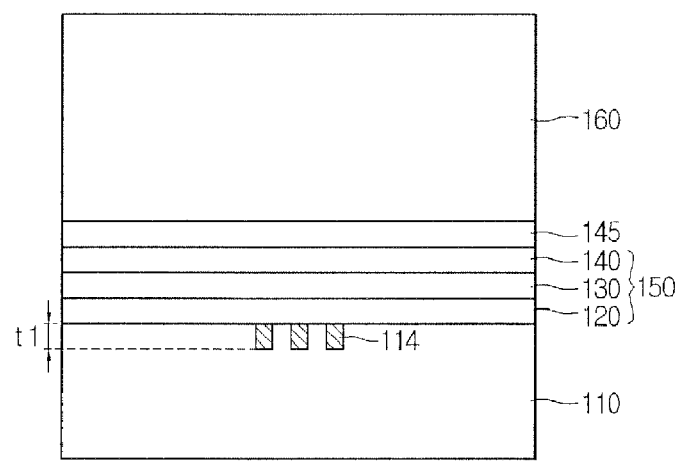

Referring to FIGS. 6 and 7, a light emitting structure 150 is formed on one surface of the insulating substrate 110. A first conductive semiconductor layer 120, an active layer 130 and a second conductive semiconductor layer 140 are sequentially stacked to form the light emitting structure 150. Here, the first conductive semiconductor layer 120 includes an n-type nitride layer doped with impurities such as Si. The active layer 130 may have a single or a multiple quantum well (MQW) structure. The second conductive semiconductor layer 140 includes a p-type nitride layer doped with impurities such as Mg. The n-type and p-type nitride layers are formed of $In_x(Al_yGa_{1-y})N$ ($0 \leq x \leq 1$, $0 \leq y \leq 1$).

The light emitting structure 150 may be formed using various methods such as a metal organic chemical vapor deposition (MOCVD), a molecular beam epitaxy (MBE), and a hydride vapor phase epitaxy (HVPE).

Also, at least one buffer layer (not shown) formed of such as GaN, AN, AlGaN, InGaN and AlGaInN may be interposed between the insulating substrate 110 and the first conductive semiconductor layer 120, to act as a buffer against strain with the insulating substrate 110.

The light emitting structure 150 includes a first conductive semiconductor layer 120 of a p-type nitride layer and a second conductive layer 140 of a n-type nitride layer. The light emitting structure 150 may have npn or pnp junction structure instead of pn or np junction structure. The above-described structure of the light emitting structure 150 is to be considered illustrative, and not restrictive.

A second electrode 145 is formed on a bottom of the light emitting structure 150 or on another surface of the second conductive semiconductor layer 140. The second electrode 145 may be a p-type electrode formed of one of Ti, Al, Rd, Pt, Ta, Ni, Cr, Au and Ag, or an alloy of at least two metals thereof.

A conductive supporting substrate 160 is formed on another surface of the second electrode 145. The conductive supporting substrate 160 may be realized as a submount substrate for supporting a semiconductor layer, or may be formed using a plating or a wafer bonding. The conductive supporting substrate 160 is under the light emitting structure 150 so that a vertical structure may be realized with only a simple bonding. The conductive supporting substrate 160 are available for manufacturing and driving a device because of its high thermal and electric conductivity.

Thereafter, the insulating substrate is removed from another surface of the insulating substrate 110 until the contact groove 112 is exposed, the another surface being a surface opposite to the one surface of the insulating substrate in which the contact groove has been formed as described above.

Here, a portion of the insulating substrate 110 is removed, so that the contact groove 112 has a thickness (t1) of 5~100μm. At least one of a wet etching, a dry etching and a mechanical polishing can be used to remove a portion of the insulating substrate 110. For this, one of an electron cyclotron resonance (ECR), a chemically assisted ion beam etching (CAIBE), an inductively coupled plasma (ICP) and a reactive ion etching (RIE) may be used, for example. One of $BCl_3$, $Cl_2$ and HBr, or a mixture gas thereof is used as an etching gas, and at least one of Ar and $H_2$ gas is used as an additive gas for the ICP and the RIE.

The wet etching may be performed using a phosphoric acid and/or a sulfuric acid. A grinding, a lapping, or a polishing and a laser may be used as the mechanical polishing.

When the filler 114 or the contact groove 112 is exposed to another surface of the insulating substrate 110, the insulating substrate has a thickness of 5~100μm, which is smaller than a depth of the contact groove 112. Also, another surface of the insulating substrate 110 may not be flat.

Figure 8:
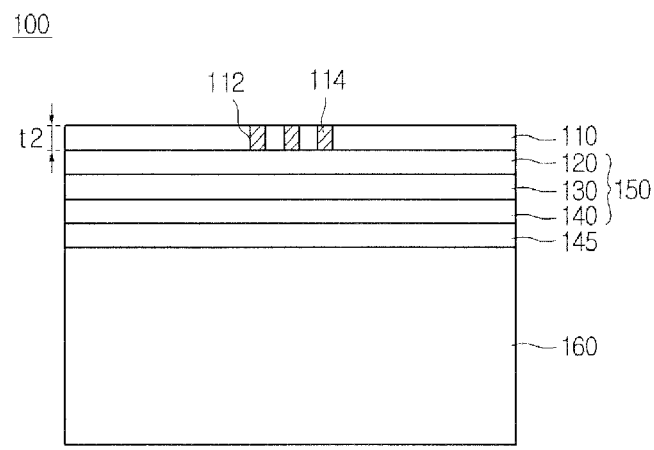

Referring to FIGS. 7 and 8, the insulating substrate may be formed to have thickness (t2) thinner than that of the contact groove 112 (t1) after another surface thereof is removed.

Figure 9:
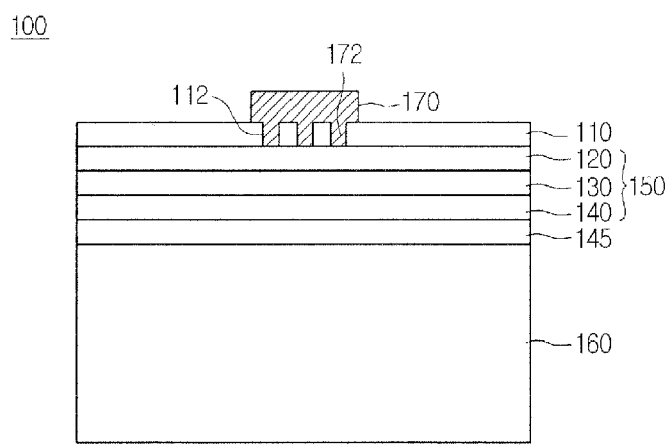

Referring to FIGS. 8 and 9, the filler 114 that has filled the contact groove 112 of the insulating substrate 110 is removed. For example, $SiO_2$ filler may be removed using such as a buffered oxide etchant (BOE). The filler 114 may not be removed if the filler is a material, such as ITO, that can make an ohmic contact with the first conductive semiconductor layer 120.

When the filler 114 is removed from another surface of the contact groove 112 of the insulating substrate 110, a first electrode 170 is formed on a region where the contact groove 112 is formed. In this case, the first electrode 170 is deposited on another surface of the insulating substrate 110 and the contact groove 112 to a pre-determined thickness using an electron beam deposition.

The first electrode 170 may be formed to a thickness of 1000 Å~10 μm, which may vary with the size of the light emitting device.

The first electrode 170 may be made of one of Ti, Al, In, Pd, Co, Ni, Si, Ge, Cr, Ag, Au, Rh, Pt and Ta, or an alloy of at least two thereof. A lower portion of the first electrode 170 fills the contact groove 112 to act as a contact protrusion 172, which connects the first electrode 170 and the first conductive semiconductor layer 120 of the light emitting structure 150.

According to an embodiment of the present invention, it is possible to protect a semiconductor nitride layer from damage which may be caused when the insulating substrate is separated thoroughly, and to form a stable first electrode 170 on the insulating substrate 110. Further, it is also possible to prevent the deterioration of the light emitting device by connecting the first electrode 170 to a nitride semiconductor layer.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

Industrial Applicability

According to an embodiment, a contact groove is formed on an insulating substrate, and a conductive material, i.e., a contact protrusion, which fills the contact groove, connects electrically a first electrode and a semiconductor layer of the light emitting structure. Accordingly, it is possible to prevent damage to the semiconductor light emitting device, which may be caused by the removal of the insulating substrate.

The invention claimed is:

1. A semiconductor light emitting device comprising:
a light emitting structure including a first conductive semiconductor layer, a second conductive semiconductor layer, and an active layer between the first conductive semiconductor layer and the second conductive semiconductor layer;
a first electrode on the light emitting structure;
an insulating substrate between the light emitting structure and the first electrode;
a plurality of contact protrusions disposed between the first electrode and the first conductive semiconductor layer and directly contacted with the first electrode and the first conductive semiconductor layer;
a second electrode under the light emitting structure; and
a conductive supporting substrate under the second electrode,
wherein the second electrode is disposed between the light emitting structure and the conductive supporting substrate,
wherein the insulating substrate includes a plurality of contact grooves in contact with the first electrode and the first conductive semiconductor layer,
wherein the first electrode is electrically connected to the first conductive semiconductor layer and the second electrode is electrically connected to the second conductive semiconductor layer, and
wherein the conductive supporting substrate physically contacts with the second electrode and has a thickness thicker than that of the insulating substrate,
wherein the contact protrusions of the plurality of contact protrusions are disposed in each of the contact grooves,
wherein the insulating substrate includes a plurality of inner portions between the plurality of contact protrusions.

2. The semiconductor light emitting device according to claim 1, wherein the at least one contact groove has a circular or polygonal shape, a shape of at least one line, a shape of a plurality of lines crossing each other, or a radial shape.

3. The semiconductor light emitting device according to claim 1, wherein the insulating substrate has a thickness between 5 μm and 100 μm, and wherein the at least one contact groove has a depth equal to or larger than the thickness of the insulating substrate.

4. The semiconductor light emitting device according to claim 3, wherein the first conductive semiconductor layer includes an n-type nitride-based semiconductor layer between the insulating and the active layer, and the second conductive semiconductor layer includes a p-type nitride-based semiconductor layer between the active layer and the second electrode.

5. The semiconductor light emitting device according to claim 1, wherein the insulating substrate comprises a sapphire substrate.

6. The semiconductor light emitting device according to claim 1, wherein the plurality of contact protrusions is formed of a conductive semiconductor material.

7. The semiconductor light emitting device according to claim 1, wherein the conductive supporting substrate has a width equal to that of the second electrode.

8. The semiconductor light emitting device according to claim 7, wherein the first electrode is disposed on an area of a top surface of the insulating substrate,
wherein the insulating substrate has a width wider than that of the first electrode and has a width equal to that of the conductive support substrate.

9. The semiconductor light emitting device according to claim 7, wherein the second electrode has a width larger than that of the first electrode.

10. The semiconductor light emitting device according to claim 1, wherein the conductive supporting substrate and the insulating substrate are planar-type substrates.

11. The semiconductor light emitting device according to claim 1, wherein at least one of the layers of the light emitting structure includes an $In_x(Al_yGa_{1-y})N$ ($0 \leq x \leq 1$, $0 \leq y \leq$) layer.

12. The semiconductor light emitting device according to claim 1, wherein the plurality of contact protrusions include an ITO material.

13. The semiconductor light emitting device according to claim 1, wherein the semiconductor light emitting device is a light emitting diode chip.

* * * * *